United States Patent
Oyama et al.

(10) Patent No.: US 12,538,751 B2
(45) Date of Patent: *Jan. 27, 2026

(54) METHOD FOR MANUFACTURING SEMICONDUCTOR DEVICE, METHOD FOR MANUFACTURING FILM MATERIAL FOR TEMPORARY FIXING, AND FILM MATERIAL FOR TEMPORARY FIXING

(71) Applicant: Resonac Corporation, Tokyo (JP)

(72) Inventors: Yasuyuki Oyama, Tokyo (JP); Emi Miyazawa, Tokyo (JP); Yuta Akasu, Tokyo (JP); Ryoji Furutani, Tokyo (JP)

( * ) Notice: Subject to any disclaimer, the term of this patent is extended or adjusted under 35 U.S.C. 154(b) by 97 days.

This patent is subject to a terminal disclaimer.

(21) Appl. No.: 18/246,854

(22) PCT Filed: Sep. 29, 2021

(86) PCT No.: PCT/JP2021/035959
§ 371 (c)(1),
(2) Date: Mar. 28, 2023

(87) PCT Pub. No.: WO2022/071431
PCT Pub. Date: Apr. 7, 2022

(65) Prior Publication Data
US 2023/0369093 A1   Nov. 16, 2023

(30) Foreign Application Priority Data
Oct. 2, 2020  (JP) .................................. 2020-167863

(51) Int. Cl.
*H01L 21/683* (2006.01)
*B32B 7/06* (2019.01)
(Continued)

(52) U.S. Cl.
CPC ............ *H01L 21/6835* (2013.01); *B32B 7/06* (2013.01); *C09J 7/10* (2018.01); *C09J 7/387* (2018.01);
(Continued)

(58) Field of Classification Search
CPC ......... B32B 7/06; B32B 43/006; B32B 37/26; B32B 2037/268; C09J 2453/00;
(Continued)

(56) References Cited

U.S. PATENT DOCUMENTS

| 9,884,979 B2 | 2/2018 | Yasuda et al. |
| 9,953,945 B2 | 4/2018 | Kim et al. |

(Continued)

FOREIGN PATENT DOCUMENTS

| JP | 2009-132867 | 6/2009 |
| JP | 2010-212474 | 9/2010 |

(Continued)

OTHER PUBLICATIONS

International Search Report dated Nov. 30, 2021 for PCT/JP2021/035959.

(Continued)

*Primary Examiner* — Philip C Tucker
*Assistant Examiner* — Jimmy R Smith, Jr.
(74) *Attorney, Agent, or Firm* — SHIPWAY IP

(57) ABSTRACT

A method for manufacturing a semiconductor device, the method including irradiating a laminated body for temporary fixing with light and thereby separating the semiconductor member from a resin layer for temporary fixing. The laminated body for temporary fixing is formed by a method including: laminating a film material for temporary fixing on a light-absorbing layer in a direction in which a first principal surface is in contact with the light-absorbing layer; and peeling off a second release film from the film material for (Continued)

temporary fixing to expose a second principal surface. When the maximum values of logarithmic decrements of the first principal surface and the second principal surface of the resin layer for temporary fixing in rigid pendulum measurement are designated as $\delta_{max}1$ and $\delta_{max}2$, respectively, $\delta_{max}2$ is smaller than $\delta_{max}1$.

9 Claims, 9 Drawing Sheets

(51) Int. Cl.
  *C09J 7/10* (2018.01)
  *C09J 7/38* (2018.01)
  *C09J 7/40* (2018.01)
  *H01L 21/56* (2006.01)

(52) U.S. Cl.
  CPC ............ *C09J 7/405* (2018.01); *H01L 21/568* (2013.01); *C09J 2453/00* (2013.01); *C09J 2467/005* (2013.01); *H01L 2221/68386* (2013.01)

(58) Field of Classification Search
  CPC ........ C09J 2467/005; C09J 7/10; C09J 7/387; C09J 7/405; C09J 7/40; C09J 7/401; C09J 7/403; C09J 7/50; H01L 21/30; H01L 21/568; H01L 21/683; H01L 21/6835; H01L 21/6836; H01L 2221/68318; H01L 2221/68381; H01L 2221/68386; H01L 23/3107; B29C 33/68
  See application file for complete search history.

(56) References Cited

U.S. PATENT DOCUMENTS

| | | | |
|---|---|---|---|
| 11,267,954 | B2 | 3/2022 | Sugimoto et al. |
| 2022/0028722 | A1 | 1/2022 | Miyazawa et al. |
| 2022/0148905 | A1* | 5/2022 | Priewasser ............... C09J 7/387 |
| 2023/0044439 | A1* | 2/2023 | Yamamoto ............ H01L 23/296 |
| 2023/0167215 | A1 | 6/2023 | Fukao et al. |

FOREIGN PATENT DOCUMENTS

| | | |
|---|---|---|
| JP | 2012-054431 | 3/2012 |
| JP | 2012-126803 | 7/2012 |
| JP | 2013-033814 | 2/2013 |
| JP | 2015-183162 | 10/2015 |
| JP | 2016-138182 | 8/2016 |
| JP | 2018-063972 | 4/2018 |
| JP | 2018-074115 | 5/2018 |
| JP | 2020-088264 | 6/2020 |
| TW | 200308008 | 12/2003 |
| TW | 201602296 | 1/2016 |
| TW | 201936411 | 9/2019 |
| WO | 03/083002 | 10/2003 |
| WO | 2015/146312 | 10/2015 |
| WO | 2019/106846 | 6/2019 |
| WO | 2019/107508 | 6/2019 |
| WO | 2019/216262 | 11/2019 |
| WO | 2020/111146 | 6/2020 |
| WO | 2020/111154 | 6/2020 |
| WO | 2020/111193 | 6/2020 |
| WO | 2020/137980 | 7/2020 |

OTHER PUBLICATIONS

International Preliminary Report on Patentability with Written Opinion dated Apr. 13, 2023 for PCT/JP2021/035959.
International Search Report dated Dec. 28, 2021 for PCT/JP2021/035169.
International Preliminary Report on Patentability with Written Opinion dated Apr. 13, 2023 for PCT/JP2021/035169.
Soei Patent and Law Firm, Statement of Related Matters, dated Feb. 21, 2025.

* cited by examiner (e)

(f)

(a)

(b)

(a)

(b)

METHOD FOR MANUFACTURING SEMICONDUCTOR DEVICE, METHOD FOR MANUFACTURING FILM MATERIAL FOR TEMPORARY FIXING, AND FILM MATERIAL FOR TEMPORARY FIXING

CROSS-REFERENCE TO RELATED APPLICATIONS

This application is a 35 U.S.C. § 371 national phase application of PCT/JP2021/035959, filed on Sep. 29, 2021, which claims priority to Japanese Patent Application No. 2020-167863, filed on Oct. 2, 2020.

TECHNICAL FIELD

The present disclosure relates to a method for manufacturing a semiconductor device, a method for manufacturing a film material for temporary fixing, and a film material for temporary fixing.

BACKGROUND ART

Semiconductor devices may be manufactured by a method in which a semiconductor member is processed in a state of being temporarily fixed to a support member, and then the semiconductor member is separated from the support member. For example, Patent Literature 1 discloses a method of temporarily fixing a semiconductor member to a support member, with a temporary fixing material layer having a resin layer for temporary fixing interposed therebetween, and separating the semiconductor member from the support member by irradiation with light after a processing treatment.

CITATION LIST

Patent Literature

Patent Literature 1: International Publication WO 2020/111193

SUMMARY OF INVENTION

Technical Problem

As a part of the resin of a temporary fixing material layer (resin layer for temporary fixing) remains on the semiconductor member separated from the support member, unnecessary resin residue may be generated.

An aspect of the present disclosure relates to a method in which generation of resin residue on a semiconductor member caused by separation can be suppressed in a case where a semiconductor device is manufactured by a method including separating a semiconductor member from a resin layer for temporary fixing through irradiation with light, and a film material for temporary fixing that can be used in the above-described method.

Solution to Problem

An aspect of the present disclosure relates to a method for manufacturing a semiconductor device, the method including: forming a laminated body for temporary fixing that includes a support substrate having a support surface and a back surface on the opposite side thereof, a light-absorbing layer, and a resin layer for temporary fixing having a first principal surface and a second principal surface on the opposite side thereof, and in which the light-absorbing layer and the resin layer for temporary fixing are laminated on the support surface in this order; temporarily fixing a semiconductor member on the resin layer for temporary fixing; irradiating the laminated body for temporary fixing with light from the back surface side; and separating the semiconductor member from the resin layer for temporary fixing, in this order.

The laminated body for temporary fixing has a resin layer for temporary fixing, a first release film, and a second release film and is formed by a method including: preparing a film material for temporary fixing having the first release film, the resin layer for temporary fixing, and the second release film laminated in this order in a direction in which the first release film is in contact with the first principal surface of the resin layer for temporary fixing and the second release film is in contact with the second principal surface of the resin layer for temporary fixing; peeling off the first release film from the film material for temporary fixing and laminating the film material for temporary fixing on the light-absorbing layer provided on the support surface in a direction in which the exposed first principal surface of the resin layer for temporary fixing is in contact with the light-absorbing layer; and peeling off the second release film from the film material for temporary fixing and exposing the second principal surface of the resin layer for temporary fixing. When the maximum values of logarithmic decrements of the first principal surface and the second principal surface of the resin layer for temporary fixing in rigid pendulum measurement are designated as $\delta_{max}1$ and $\delta_{max}2$, respectively, $\delta_{max}2$ is smaller than $\delta_{max}1$.

Another aspect of the present disclosure relates to a method for manufacturing a film material for temporary fixing, the method including: applying a resin varnish including a solvent on a first release film to form a film of the resin varnish, subsequently removing the solvent from the film to form a resin layer for temporary fixing having a first principal surface that is in contact with the first release film and a second principal surface on the opposite side thereof, on the first release film; and sticking a second release film together with the second principal surface of the resin layer for temporary fixing. The peel strength of a surface of the first release film, the surface being in contact with the resin layer for temporary fixing, is smaller than the peel strength of a surface of the second release film, the surface being in contact with the resin layer for temporary fixing.

Still another aspect of the present disclosure relates to a film material for temporary fixing having a resin layer for temporary fixing having a first principal surface and a second principal surface on the opposite side thereof, a first release film, and a second release film. The first release film, the resin layer for temporary fixing, and the second release film are laminated in this order in a direction in which the first release film is in contact with the first principal surface of the resin layer for temporary fixing, and the second release film is in contact with the second principal surface of the resin layer for temporary fixing. When the maximum values of logarithmic decrements of the first principal surface and the second principal surface of the resin layer for temporary fixing in rigid pendulum measurement are designated as $\delta_{max}1$ and $\delta_{max}2$, respectively, $\delta_{max}2$ is smaller than $\delta_{max}1$. The peel strength of a surface of the first release film, the surface being in contact with the resin layer for temporary fixing, is smaller than the peel strength of a surface of the second release film, the surface being in contact with the resin layer for temporary fixing.

Advantageous Effects of Invention

According to an aspect of the present disclosure, in a case where a semiconductor device is manufactured by a method including separating a semiconductor member from a resin layer for temporary fixing through irradiation with light, generation of resin residue on the semiconductor member caused by the separation can be suppressed.

DESCRIPTION OF EMBODIMENTS

The present invention is not intended to be limited to the following example.

Figure 1:
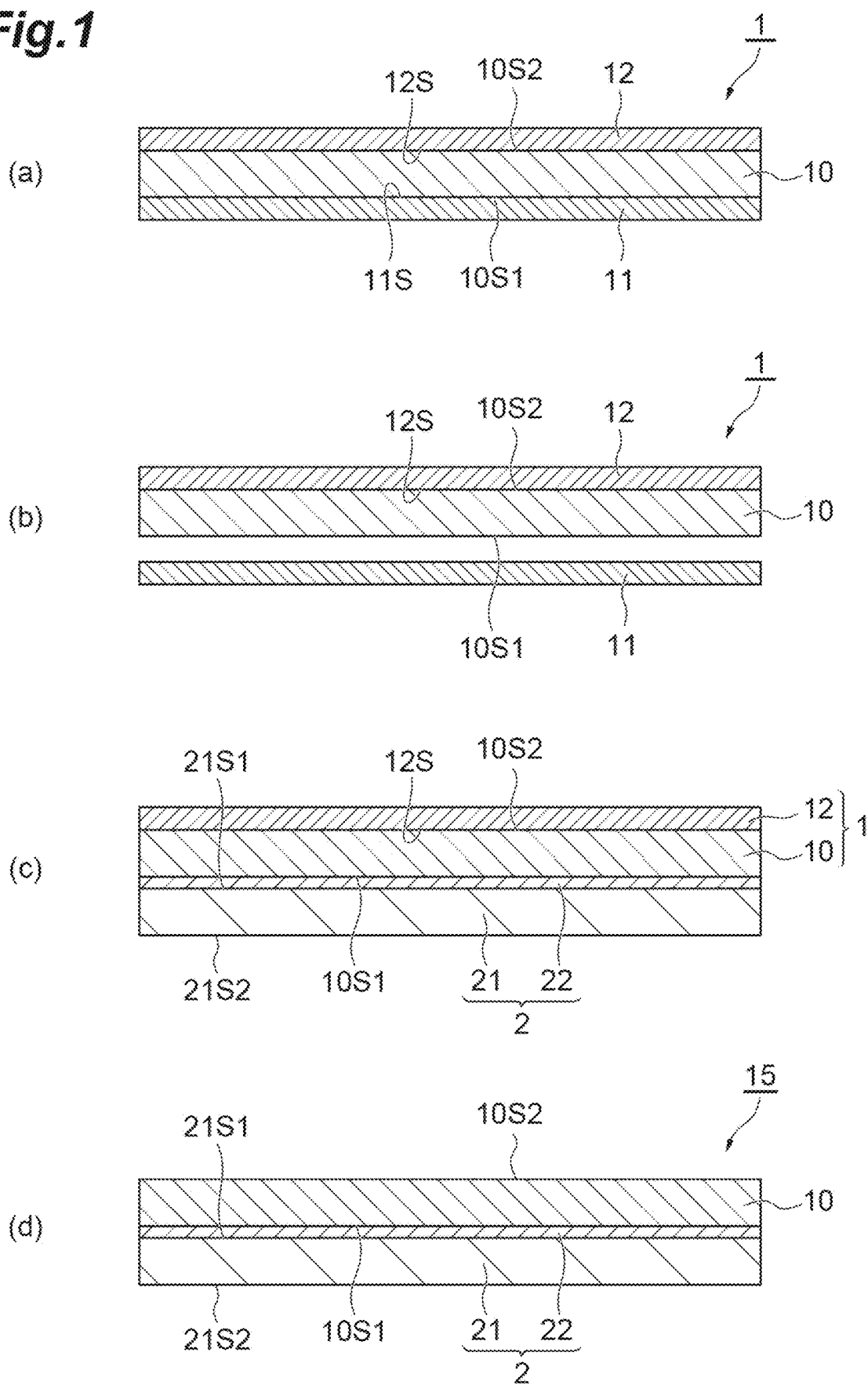
FIG. 1 is a process diagram illustrating an example of a method for manufacturing a semiconductor device.
Figure 2:
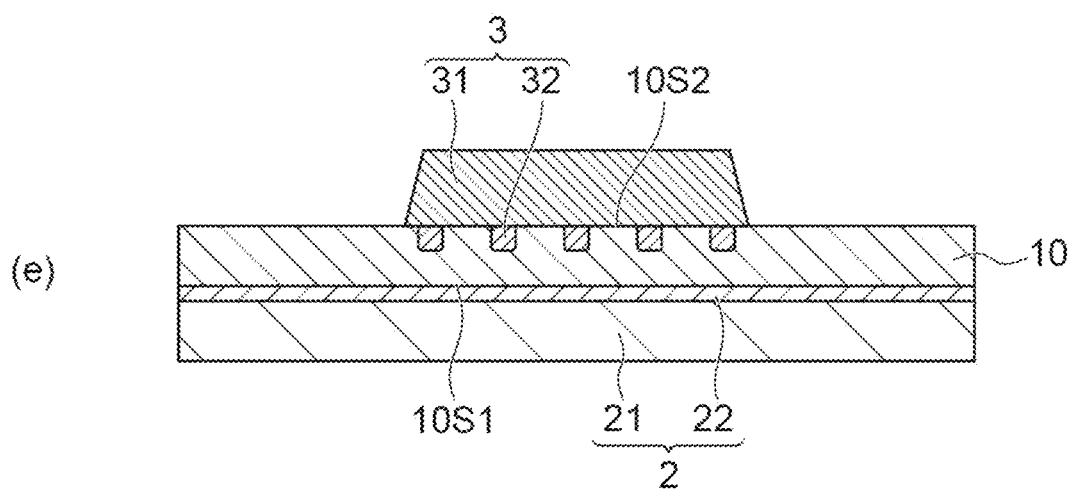
FIG. 2 is a process diagram illustrating an example of the method for manufacturing a semiconductor device.
Figure 2:
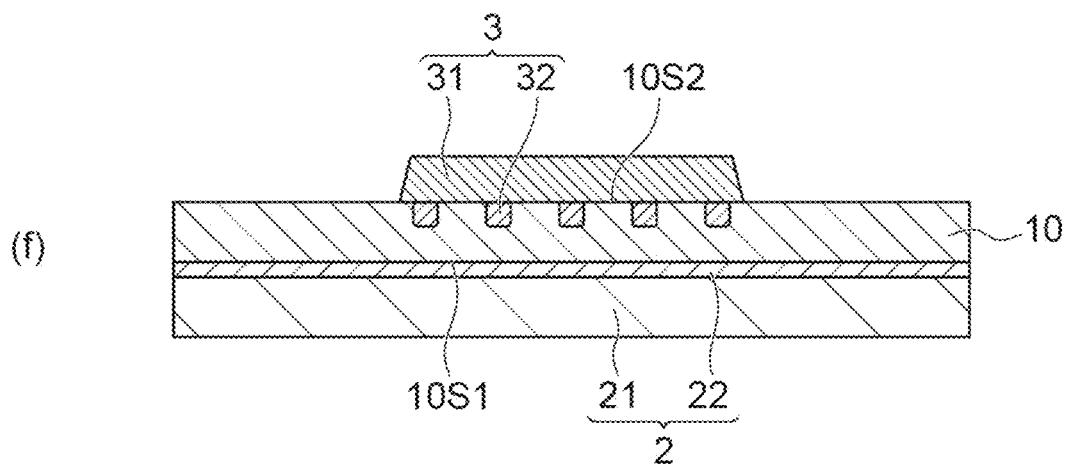
Figure 3:
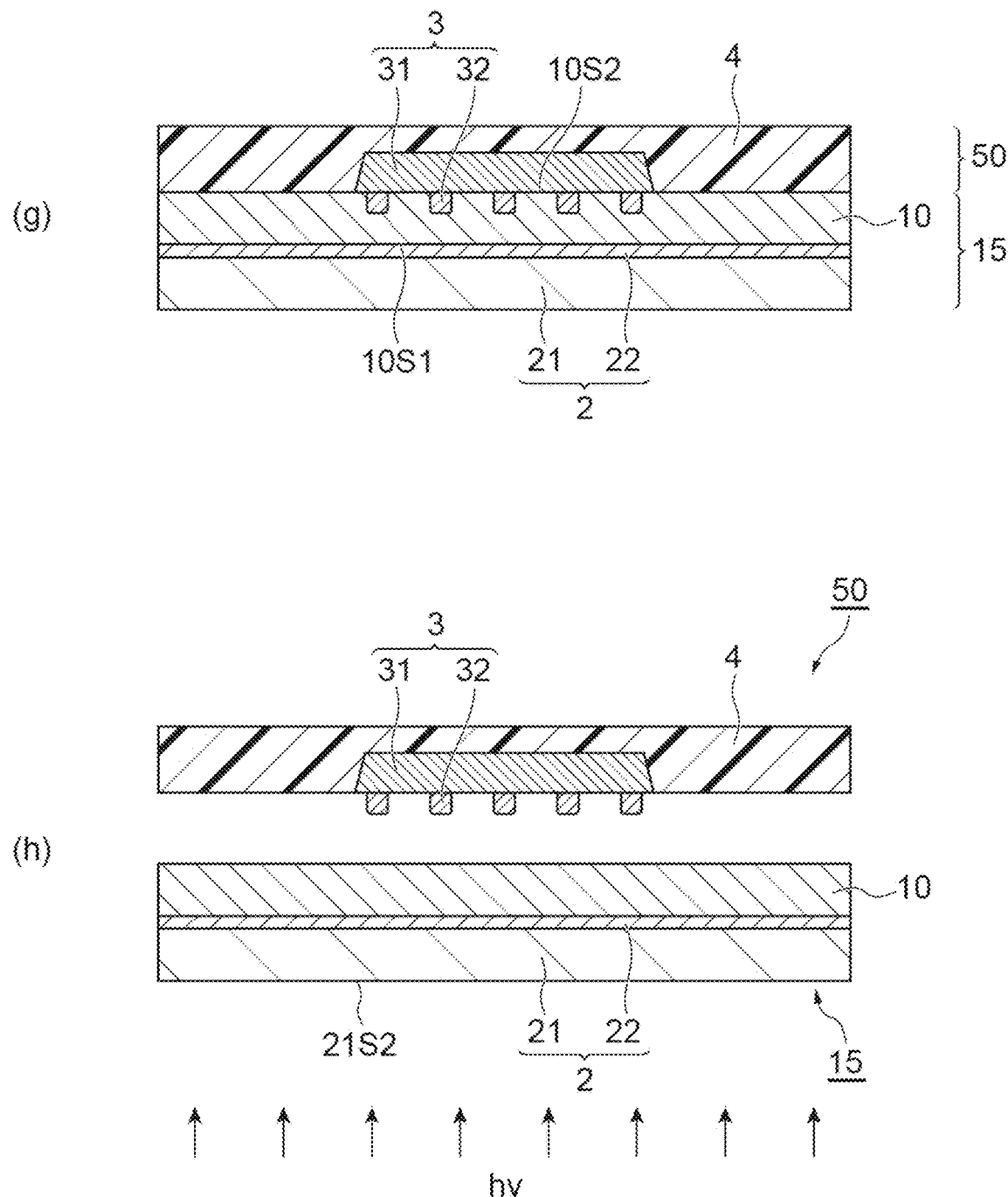
FIG. 3 is a process diagram illustrating an example of the method for manufacturing a semiconductor device.

FIG. 1, FIG. 2, and FIG. 3 are process diagrams showing an example of a method for manufacturing a semiconductor device. The method shown in FIG. 1 to FIG. 3 includes: forming a laminated body for temporary fixing 15 that includes a support substrate 21 having a support surface 21S1 and a back surface 21S2 on the opposite side thereof, a light-absorbing layer 22, and a resin layer for temporary fixing 10 having a first principal surface 10S1 and a second principal surface 10S2 on the opposite side thereof, and in which the light-absorbing layer 22 and the resin layer for temporary fixing 10 are laminated in this order on the support surface 21S1; temporarily fixing a semiconductor member 3 onto the resin layer for temporary fixing 10; irradiating the laminated body for temporary fixing 15 with light hv from the back surface 21S2 side; and separating the semiconductor member 3 from the resin layer for temporary fixing 10, in this order.

The laminated body for temporary fixing 15 is formed by using a film material for temporary fixing 1 having a resin layer for temporary fixing 10, a first release film 11, and a second release film 12, as shown in FIG. 1(a). The first release film 11 and the second release film 12 have a release surface 11s and a release surface 12S, respectively. The peel strength of the release surface 11S against the resin layer for temporary fixing 10 may be smaller than the peel strength of the release surface 12S against the resin layer for temporary fixing 10. In the film material for temporary fixing 1, the first release film 11, the resin layer for temporary fixing 10, and the second release film 12 are laminated in this order in a direction in which the release surface 11S of the first release film 11 is in contact with the first principal surface 10S1 of the resin layer for temporary fixing 10, and the release surface 12S of the second release film 12 is in contact with the second principal surface 10S2 of the resin layer for temporary fixing 10.

The laminated body for temporary fixing 15 is formed by a method including: preparing a film material for temporary fixing 1; peeling off the first release film 11 from the film material for temporary fixing 1 as shown in FIG. 1(b), subsequently laminating the film material for temporary fixing 1 on the light-absorbing layer 22 provided on the support surface 21S1 in a direction the exposed first principal surface 10S1 of the resin layer for temporary fixing 10 is in contact with the light-absorbing layer 22 as shown in FIG. 1(c); peeling off the second release film 12 from the film material for temporary fixing 1 as shown in FIG. 1(d), and exposing the second principal surface 10S2 of the resin layer for temporary fixing 10.

The support substrate 21 may be, for example, an inorganic glass substrate or a transparent resin substrate. The thickness of the support substrate 21 may be, for example, 0.1 to 2.0 mm.

By forming the light-absorbing layer 22 on the support surface 21S1 of the support substrate 21, a light-absorbing layer-attached support member 2 having the support substrate 21 and the light-absorbing layer 22 is prepared.

A resin layer may be provided between the support substrate and the light-absorbing layer. The resin layer may be a cured product of a curable resin layer.

An example of the light-absorbing layer 22 is a conductor layer including a conductor that absorbs light and generates heat. Examples of the conductor constituting the conductor layer as the light-absorbing layer 22 include a metal, a metal oxide, and a conductive carbon material. The metal may be a simple metal substance such as chromium, copper, titanium, silver, platinum, or gold, or may be an alloy such as nickel-chromium, stainless steel, or copper-zinc. Examples of the metal oxide include indium tin oxide (ITO), zinc oxide, and niobium oxide. These may be used singly or in combination of two or more kinds thereof. The conductor may be chromium, titanium, or a conductive carbon material.

The light-absorbing layer 22 may be a metal layer composed of a single layer or a plurality of layers. A metal layer is likely to have a transmittance of 3.1% or less for incoherent light. For example, the light-absorbing layer 22 may be a metal layer composed of a copper layer and a titanium layer. The metal layer as the light-absorbing layer 22 may be a layer formed by physical vapor phase deposition (PVD) such as vacuum vapor deposition and sputtering, or chemical vapor phase deposition (CVD) such as plasma chemical vapor deposition, or may be a plating layer formed by electrolytic plating or electroless plating. According to physical vapor phase deposition, even when the support substrate 21 may have a large area, a metal layer as the light-absorbing layer 22 that covers the surface of the support substrate 21 can be efficiently formed.

When the light-absorbing layer 22 is a single metal layer, the light-absorbing layer 22 may include at least one metal selected from the group consisting of thallium (Ta), platinum (Pt), nickel (Ni), titanium (Ti), tungsten (W), chromium (Cr), copper (Cu), aluminum (Al), silver (Ag), and gold (Au).

The light-absorbing layer 22 may be composed of two layers, namely, a first layer and a second layer, and may be laminated in order of the first layer and the second layer from the support substrate 21 side. In this case, for example, when the first layer has high light absorption properties and the second layer has a high coefficient of thermal expansion and a high elastic modulus, particularly satisfactory releasability is likely to be obtained. From this viewpoint, for example, the first layer may include at least one metal selected from the group consisting of thallium (Ta), platinum (Pt), nickel (Ni), titanium (Ti), tungsten (W), and chromium (Cr), and the second layer may include at least one metal selected from the group consisting of copper (Cu), aluminum (Al), silver (Ag), and gold (Au). The first layer may include at least one metal selected from the group consisting of titanium (Ti), tungsten (W), and chromium (Cr), and the second layer may include at least one metal selected from the group consisting of copper (Cu) and aluminum (Al).

Another example of the light-absorbing layer is a layer containing conductive particles that absorb light and generate heat and a binder resin in which the conductive particles are dispersed. The conductive particles may be particles including the above-mentioned conductor. For example, the light-absorbing layer 22 may be a layer including conductive particles and a curable resin composition. The curable resin composition constituting the light-absorbing layer can include a component similar to the curable resin composition that constitutes a curable resin layer in the part other than the light-absorbing layer. The curable resin composition that constitutes the light-absorbing layer may be identical with or different from the curable resin composition that constitutes the curable resin layer in the part other than the light-absorbing layer. The content of the conductive particles in the light-absorbing layer may be 10 to 90 parts by mass with respect to the total quantity of components other than the conductive particles in the light-absorbing layer, that is, 100 parts by mass of the mass of the binder resin or the curable resin composition. When the content of the conductive particles is large, the light-absorbing layer is likely to have a transmittance of 3.1% or less for incoherent light. From the viewpoint of transmittance, the content of the conductive particles may be 20% by mass or more, or 30% by mass or more.

The light-absorbing layer including conductive particles and a binder resin can be formed by, for example, a method including applying a varnish containing conductive particles, a binder resin, and an organic solvent on a support member or a resin layer and removing the organic solvent from the coating film. A light-absorbing layer 22 that has been produced in advance may be laminated on the support substrate 21 or a resin layer.

The thickness of the light-absorbing layer 22 may be 1 to 5000 nm or 100 to 3000 nm, from the viewpoint of light releasability. When the thickness of the light-absorbing layer 22 is 50 to 300 nm, the light-absorbing layer 22 is likely to have a sufficiently low transmittance. When the light-absorbing layer 22 is a metal layer composed of a single layer or a plurality of layers, the thickness of the light-absorbing layer 22 (or metal layer) may be 75 nm or more, 90 nm or more, or 100 nm or more, or may be 1000 nm or less, from the viewpoint of satisfactory releasability. Particularly when the light-absorbing layer 22 is a single metal layer, the thickness of the light-absorbing layer 22 (or metal layer) may be 100 nm or more, 125 nm or more, 150 nm or more, or 200 nm or more, or may be 1000 nm or less, from the viewpoint of satisfactory releasability. Even in a case where the light-absorbing layer 22 is a metal layer including a metal having comparatively low light absorption properties (for example, Cu or Ni) or a metal layer including a metal having a comparatively low coefficient of thermal expansion (for example, Ti), when the thickness of the light-absorbing layer 22 is large, more satisfactory releasability tends to be easily obtained.

After the laminated body for temporary fixing 15 is formed, a semiconductor member 3 is temporarily fixed on the resin layer for temporary fixing 10. The semiconductor member 3 has a main body part 31 and a connection terminal 32 provided on the outer surface of the main body part 31. A portion or the entirety of the connection terminal 32 may be embedded in the resin layer for temporary fixing 10. The semiconductor member 3 may be a semiconductor wafer or a semiconductor chip component obtained by dividing a semiconductor wafer. The semiconductor member 3 may have a rewiring layer provided on the main body part 31 and the semiconductor member 3 may be temporarily fixed in a direction in which the rewiring layer is located on the resin layer for temporary fixing 10 side. Two or more semiconductor members may be temporarily fixed on one laminated body for temporary fixing, or other passive components and the like may be temporarily fixed together with the semiconductor member.

When the resin layer for temporary fixing 10 is a layer including a curable resin composition, when the semiconductor member 3 is disposed on the resin layer for temporary fixing 10 and then the resin layer for temporary fixing 10 is thermally cured or photocured, the semiconductor member 3 is temporarily fixed to the cured resin layer for temporary fixing 10. The conditions for thermal curing may be, for example, 300° C. or lower or 100° C. to 200° C. for 1 to 180 minutes or 1 to 60 minutes.

The temporarily fixed semiconductor member 3 may be processed. FIG. 2(*f*) shows an example of processing including thinning of the main body part 31 of the semiconductor member. Processing of the semiconductor member is not particularly limited to this, and examples can include thinning of the semiconductor member (main body part), division (dicing) of the semiconductor member, formation of a through-electrode, an etching treatment, a reflow plating treatment, a sputtering treatment, and combinations of these.

Thinning of the main body part 31 of the semiconductor member 3 is carried out by grinding a surface of the main body part 31 on the opposite side from the resin layer for temporary fixing 10 by using a grinder or the like. The thickness of the thinned main body part 31 may be, for example, 100 µm or less.

As shown in FIG. 3(*g*), a sealing layer 4 that seals the semiconductor member 3 is formed on the resin layer for temporary fixing 10, and thereby a sealing structural body 50 having the semiconductor member 3 and the sealing layer 4 may be formed. In a case where the temporarily fixed semiconductor member 3 is processed, usually, the sealing layer 4 is formed after processing of the semiconductor member 3.

The sealing layer 4 can be formed by using a sealant that is conventionally used for the manufacture of a semiconductor device.

For example, the sealing layer 4 may be formed by using a thermally curable resin composition. The thermally curable resin composition used for forming the sealing layer 4 includes, for example, an epoxy resin such as a cresol novolac epoxy resin, a phenol novolac epoxy resin, a biphenyl diepoxy resin, or a naphthol novolac epoxy resin. The sealing layer 4 and the thermally curable resin composition for forming this sealing layer may include a filler and/or additives such as a flame retardant.

The sealing layer 4 is formed by using, for example, a solid material, a liquid material, a fine granular material, or a sealing film. When a sealing film is used, a compression sealing molding machine, a vacuum lamination apparatus, and the like are used. For example, the sealing layer 4 can be formed by coating the semiconductor member 3 with a sealing film that has been thermally melted by using these apparatuses under the conditions of 40° C. to 180° C. (or 60° C. to 150° C.), 0.1 to 10 MPa (or 0.5 to 8 MPa), and 0.5 to 10 minutes. The thickness of the sealing film may be 50 to 2000 μm, 70 to 1500 μm, or 100 to 1000 μm. After the sealing layer 4 is formed, the sealing structural body 50 may be divided into a plurality of portions including the semiconductor member 3.

Figure 4:
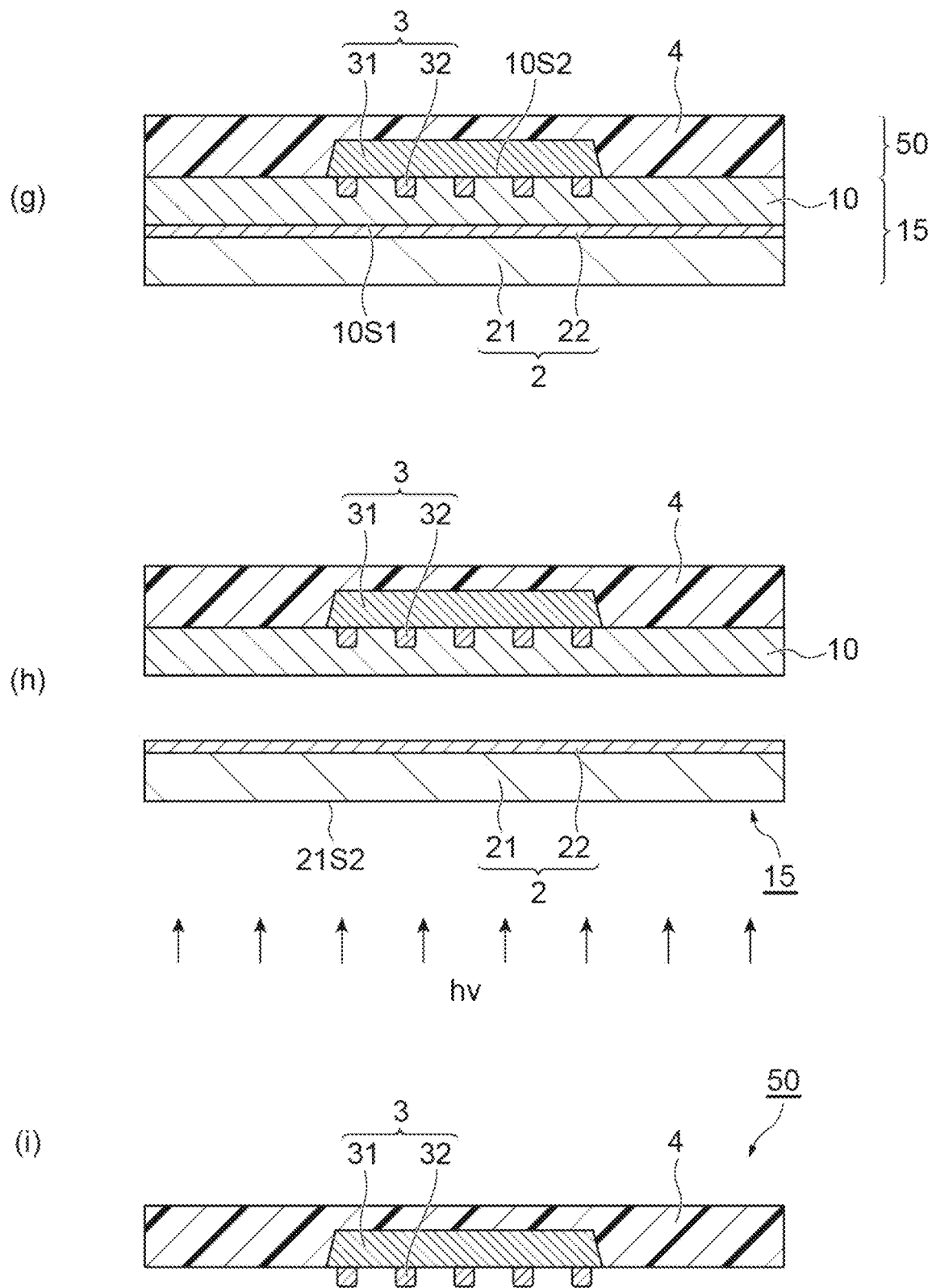
FIG. 4 is a process diagram illustrating an example of the method for manufacturing a semiconductor device.

As shown in FIG. 3(h), the laminated body for temporary fixing 15 is irradiated with light hv from the back surface 21S2 side, and then the semiconductor member 3 is separated from the resin layer for temporary fixing 10. When the sealing structural body 50 is formed on the resin layer for temporary fixing 10, the sealing structural body 50 is separated from the resin layer for temporary fixing 10. As shown in FIG. 4, the semiconductor member 3 (or sealing structural body 50) may be separated from the resin layer for temporary fixing 10 by a method including separating the resin layer for temporary fixing 10 from the light-absorbing layer 22 by irradiating the laminated body for temporary fixing 15 with light form the back surface 21S2 side; and peeling off the resin layer for temporary fixing 10 from the semiconductor member 3 (or sealing structural body 50), in this order.

As a result of irradiation with light hv, the light-absorbing layer 22 absorbs light and instantaneously generates heat. Due to the generated heat, for example, melting of the resin layer for temporary fixing 10, thermal stress occurring between the laminated body for temporary fixing 15 and the semiconductor member 3 (or sealing structural body 50), and scattering of the light-absorbing layer 22 may occur. Mainly because of one or two or more of these phenomena, the semiconductor member 3 (or sealing structural body 50) can be easily separated from the resin layer for temporary fixing 10 through separation from the light-absorbing layer 22 and the resin layer for temporary fixing 10. In order to separate the semiconductor member 3 (or sealing structural body 50) from the resin layer for temporary fixing 10, stress may be added to the semiconductor member 3 (or sealing structural body 50) together with irradiation with light hv or after irradiation with light hv.

The light hv may be, for example, laser light or may be incoherent light. Incoherent light is light that is not coherent light, and is an electromagnetic wave having properties of not generating interference fringes, having low coherence, and having low directivity. Incoherent light tends to attenuate as the optical path length increases. Laser light is generally coherent light whereas light such as sunlight or fluorescent lamp light is incoherent light. Incoherent light can be said to be light excluding laser light. Since the irradiation area of incoherent light is generally overwhelmingly larger than that of coherent light (that is, laser light), the number of times of irradiation can be reduced. For example, a single irradiation may cause separation of a plurality of semiconductor members 3. From these viewpoints, incoherent light may be employed.

The incoherent light may include infrared radiation. The incoherent light may be pulsed light. A light source for the incoherent light is not particularly limited; however, the light source may be a xenon lamp. A xenon lamp is a lamp that utilizes light emission caused by application and discharge in an arc tube encapsulating xenon gas.

The irradiation conditions for the xenon lamp include applied voltage, pulse width, irradiation time, irradiation distance (distance between the light source and the resin layer for temporary fixing), irradiation energy, and the like. These can be arbitrarily set according to the number of times of irradiation and the like. From the viewpoint of reducing damage of the semiconductor member 3, irradiation conditions capable of separating the semiconductor member 3 (or sealing structural body 50) by a single irradiation may be set.

Resin residue, which is a part of the resin layer for temporary fixing 10, may remain on the semiconductor member 3 separated from the resin layer for temporary fixing 10. Generation of the resin residue can be suppressed by selecting the surface that comes into contact with the semiconductor member 3 between the first principal surface 10S1 and the second principal surface 10S2 of the resin layer for temporary fixing 10 based on the logarithmic decrement in rigid pendulum measurement of these. Specifically, when the maximum value of logarithmic decrement in the rigid pendulum measurement of the first principal surface 10S1 is designated as $\delta_{max}1$, and the maximum value of logarithmic decrement in the rigid pendulum measurement of the second principal surface 10S2 is designated as $\delta_{max}2$, $\delta_{max}2$ is smaller than $\delta_{max}1$. The maximum value $\delta_{max}$ of the logarithmic decrement is a value that reflects the degree of viscosity of the surface of the resin layer for temporary fixing 10, and a surface having a small $\delta_{max}$ refers to a surface having relatively low viscosity. By disposing the resin layer for temporary fixing 10 in a direction having lower viscosity, that is, the second principal surface 10S2, which is a surface exhibiting smaller $\delta_{max}$, is in contact with the semiconductor member 3, generation of resin residue can be relatively reduced as compared with the case where the first principal surface 10S1 exhibiting larger $\delta_{max}$ is in contact with the semiconductor member 3. $\delta_{max}2$ exhibited by the second principal surface 10S2 that is in contact with the semiconductor member 3 may be, for example, 0.7 or less or 0.6 or less, or may be 0.2 or more.

Figure 5:
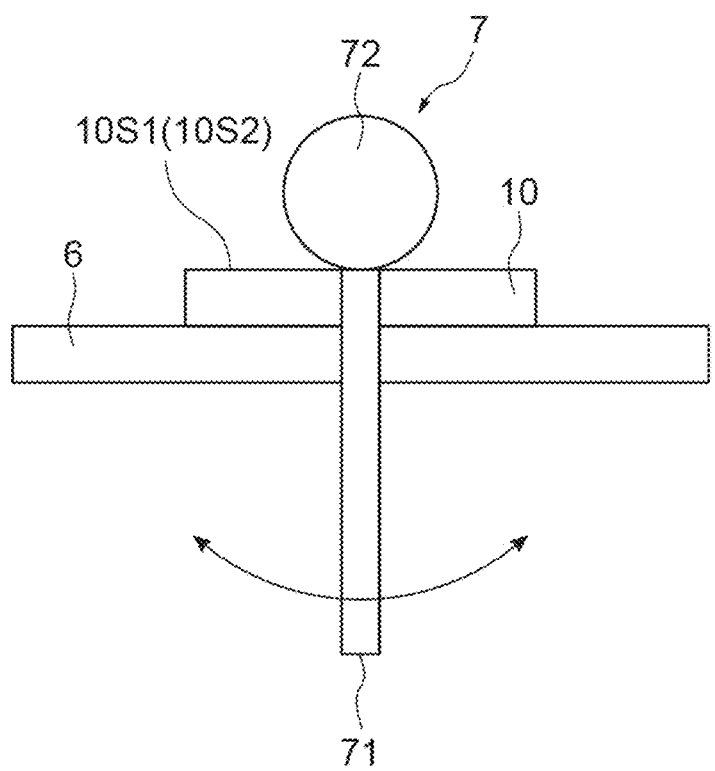
FIG. 5 is a schematic diagram illustrating a method for rigid pendulum measurement.

Here, the maximum value of logarithmic decrement in rigid pendulum measurement can be measured under the conditions in which temperature is increased from 25° C. to 150° C. at a temperature increase rate of 5° C./min. FIG. 5 is a schematic diagram showing a method for rigid pendulum measurement. In the method shown in FIG. 5, a temperature-variable stage 6 and a pendulum 7 (product code RBP040) having a frame 71 (product code: AX-FRB-100) and a cylindrical-shaped edge 72 fixed to one end of the frame 71 are used. A weight and an oscillation displacement detector are attached to the other end of the frame 71. A resin layer for temporary fixing 10 as a test specimen is fixed onto the stage 6, and the edge 72 is placed on the first principal surface 10S1 or the second principal surface 10S2 of the resin layer for temporary fixing 10. In this state, the logarithmic decrement is determined from changes in the oscillation period when the pendulum is oscillated by taking the edge 72 as a fulcrum. By making measurement while increasing the temperature of the stage 6, a curve showing the relationship between logarithmic decrement and temperature can be obtained, and the maximum value $\delta_{max}$ of the logarithmic decrement is determined from the curve. A principal surface in which the $\delta_{max}$ measured under the same conditions is relatively small, can be selected as the surface that comes into contact with the semiconductor member.

Figure 6:
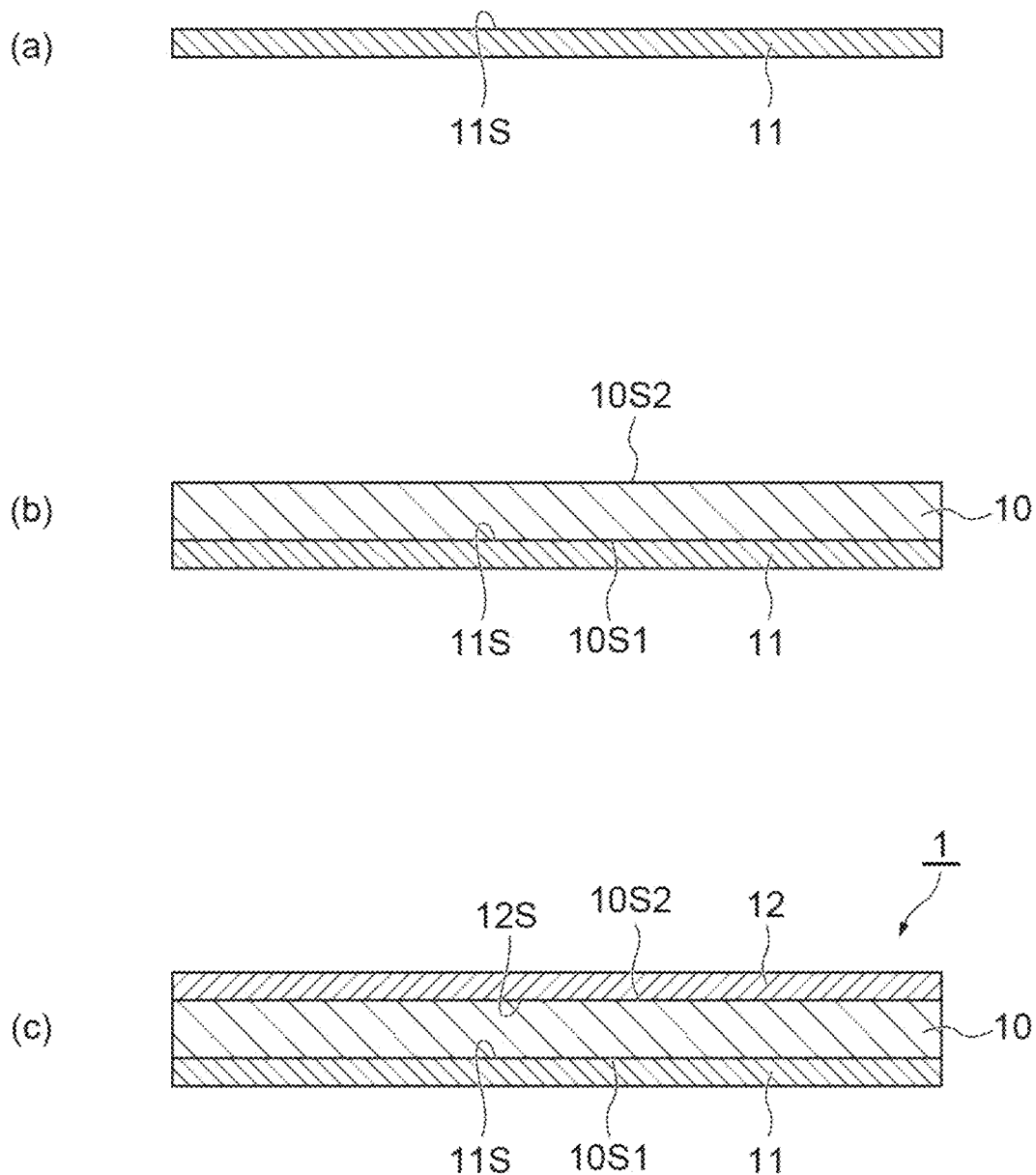
FIG. 6 is a process diagram illustrating an embodiment of a method for manufacturing a film material for temporary fixing.

FIG. 6 is a process diagram showing an example of a method for manufacturing a film material for temporary fixing 1. The method shown in FIG. 6 includes: applying a resin varnish including a solvent on a release surface 11S of a first release film 11 to form a film of a resin varnish, subsequently removing the solvent from the film to form a resin layer for temporary fixing 10 having a first principal surface 10S1 that is in contact with the first release film 11 and a second principal surface 10S2 on the opposite side thereof, on the first release film 11; and sticking a second release film 12 to the second principal surface 10S2 of the resin layer for temporary fixing 10.

When the resin layer for temporary fixing 10 is formed by such a method including application of a resin varnish, usually, the $\delta_{max}2$ of the second principal surface 10S2 that is in contact with the second release film 12 that is stuck to the formed resin layer for temporary fixing 10, is relatively smaller than the maximum value $\delta_{max}1$ of the logarithmic decrement shown by the first principal surface 10S1 that is in contact with the first release film 11 on which the resin varnish is applied.

Therefore, resin residue can be reduced by utilizing the surface on the side of the second release film 12 that is laminated as a protective film for the formed resin layer for temporary fixing 10, as a surface for temporarily fixing the semiconductor member 3. Since a protective film is usually peeled off first at the time of using a film material, an easily peelable film is used, which has relatively smaller peel strength than the base material film on which a resin varnish is applied. However, by selecting the first release film 11 and the second release film 12 such that the peel strength of the release surface 11S of the first release film 11 used as a base material film, the release surface 11S being in contact with the resin layer for temporary fixing 10, is smaller than the peel strength of the release surface 12S of the second release film 12 (protective film), the release surface 12S being in contact with the resin layer for temporary fixing 10, the film material for temporary fixing 1 can be easily applied to the above-mentioned method including first peeling off the first release film 11 from the film material for temporary fixing 1 while leaving the second release film 12.

Generally, release films classified according to the degree of releasability can be utilized as commercial products. For example, a release film having light releasability may be used as the first release film 11, and a release film having heavy releasability may be used as the second release film. For example, resin films of polyethylene terephthalate and the like having release surfaces that have been release-treated so as to have various peel strengths, can be commercially utilized.

The resin layer for temporary fixing 10 may be a layer including a curable resin composition that is cured by heat or light. The resin layer for temporary fixing 10 before curing has adhesiveness to the extent that can stick the semiconductor member 3 by pressure-bonding or the like. The cured resin layer for temporary fixing 10 retains the semiconductor member 3 for as long as necessary, such as while the semiconductor member 3 is processed.

The thickness of the resin layer for temporary fixing 10 may be, for example, 50 μm or less, 40 μm or less, or 30 μm or less and 0.1 μm or more, or may be 50 μm or less, 40 μm or less, or 30 μm or less and 1 μm or more, from the viewpoint of stress relaxation.

The storage modulus at 25° C. of the cured resin layer for temporary fixing 10 may be 5 to 100 MPa. When the storage modulus at 25° C. of the cured resin layer for temporary fixing 10 is 5 MPa or more, the support substrate 21 is likely to hold the semiconductor member 3 without bending, and resin residue tends to be further reduced. When the storage modulus at 25° C. of the cured resin layer for temporary fixing 10 is 100 MPa or less, there is a tendency that position shift of the semiconductor member 3 can be made small. From a similar viewpoint, the storage modulus at 25° C. of the cured resin layer for temporary fixing 10 may be 5.5 MPa or more, 6 MPa or more, or 6.3 MP or more and 100 MPa or less, may be 5.5 MPa or more, 6 MPa or more, or 6.3 MPa or more and 90 MPa or less, may be 5.5 MPa or more, 6 MPa or more, or 6.3 MPa or more and 80 MPa or less, may be 5.5 MPa or more, 6 MPa or more, or 6.3 MPa or more and 70 MPa or less, or may be 5.5 MPa or more, 6 MPa or more, or 6.3 MPa or more and 65 MPa or less. According to the present specification, the storage modulus of the cured resin layer for temporary fixing 10 means a value that is determined by viscoelasticity measurement that is measured under the conditions of a temperature increase rate of 5° C./min, a frequency of 1 Hz, and a tensile mode.

The storage modulus at 25° C. of the cured resin layer for temporary fixing 10 can be increased by, for example, methods of increasing the content of a hydrocarbon resin that will be described below, applying a hydrocarbon resin having a high Tg, and adding an insulating filler to a curable resin composition.

The storage modulus at 250° C. of the cured resin layer for temporary fixing 10 may be 0.70 MPa or more, 0.80 MPa or more, 0.85 MPa or more, or 0.90 MPa or more and 2.00 MPa or less, may be 0.70 MPa or more, 0.80 MPa or more, 0.85 MPa or more, or 0.90 MPa or more and 2.00 MPa or less, may be 0.70 MPa or more, 0.80 MPa or more, 0.85 MPa or more, or 0.90 MPa or more and 1.90 MPa or less, may be 0.70 MPa or more, 0.80 MPa or more, 0.85 MPa or more, or 0.90 MPa or more and 1.80 MPa or less, or may be 0.70 MPa or more, 0.80 MPa or more, 0.85 MPa or more, or 0.90 MPa or more and 1.75 MPa or less.

The curable resin composition that constitutes the resin layer for temporary fixing 10 may contain a thermosetting resin and a hydrocarbon resin. The hydrocarbon resin is a resin in which the main skeleton is composed of hydrocarbons. When the curable resin composition includes a hydrocarbon resin, a semiconductor member 3 is easily stuck to the resin layer for temporary fixing 10 at a low temperature.

From the viewpoint of low-temperature sticking properties of the resin layer for temporary fixing 10, the glass transition temperature (Tg) of the hydrocarbon resin may be 50° C. or lower. From the viewpoint of satisfactory releasability of the resin layer for temporary fixing 10, the Tg of the hydrocarbon resin may be −100° C. or higher or may be −50° C. or higher.

The Tg of the hydrocarbon resin is a mid-point glass transition temperature value obtainable by differential scanning calorimetry (DSC). The Tg of the hydrocarbon resin is specifically a mid-point glass transition temperature obtained by measuring the heat quantity change under the conditions of a temperature increase rate of 10° C./min and a measurement temperature of from −80° C. to 80° C., and performing calculation by a method according to JIS K 7121.

The hydrocarbon resin includes, for example, at least one selected from the group consisting of an ethylene-propylene copolymer, an ethylene-1-butene copolymer, an ethylene-propylene-1-butene copolymer elastomer, an ethylene-1-hexene copolymer, an ethylene-1-octene copolymer, an ethylene-styrene copolymer, an ethylene-norbornene copolymer, a propylene-1-butene copolymer, an ethylene-propylene-non-conjugated diene copolymer, an ethylene-1-butene-non-conjugated diene copolymer, an ethylene-propylene-1-butene-non-conjugated diene copolymer, polyisoprene, polybutadiene, a styrene-butadiene-styrene block copolymer (SBS), a styrene-isoprene-styrene block copolymer (SIS), a styrene-ethylene-butylene-styrene block copolymer (SEBS), a styrene-ethylene-propylene-styrene block copolymer (SEPS), and hydrogenation products of these. These hydrocarbon resins may have a carboxyl group. A carboxyl group is introduced by, for example, modification using maleic anhydride or the like. The hydrocarbon resin may include a styrene-based resin including a monomer unit derived from styrene. The styrene-based resin may be a styrene-ethylene-butylene-styrene block copolymer (SEBS).

The weight average molecular weight (Mw) of the hydrocarbon resin may be 10000 to 5000000 or 100000 to 2000000. When the weight average molecular weight is 10000 or more, heat resistance of the resin layer for temporary fixing tends to be easily secured. When the weight average molecular weight is 5000000 or less, deterioration of the flow of the resin layer for temporary fixing and deterioration of the sticking properties tend to be easily suppressed. The weight average molecular weight as used herein is a polystyrene-equivalent value obtained by gel permeation chromatography (GPC) using a calibration curve based on polystyrene standards.

The content of the hydrocarbon resin may be 40 parts by mass or more, 50 parts by mass or more, or 60 parts by mass or more and 90 parts by mass or less, may be 40 parts by mass or more, 50 parts by mass or more, or 60 parts by mass or more and 85 parts by mass or less, or may be 40 parts by mass or more, 50 parts by mass or more, or 60 parts by mass or more and 80 parts by mass or less, with respect to 100 parts by mass of the total mass of the curable resin composition that constitutes the resin layer for temporary fixing 10. When the content of the hydrocarbon resin is within these numerical value ranges, a thin and flat resin layer for temporary fixing 10 tends to be easily formed. Furthermore, there is a tendency that the resin layer for temporary fixing 10 is likely to have satisfactory sticking properties at a low temperature and an appropriate storage modulus after curing. Here, the "total mass of the curable resin composition" means the total mass of components except for the solvent that will be described below.

The thermosetting resin is a component that cures the curable resin composition by means of a thermosetting reaction. The thermosetting reaction may be a reaction of a thermoset resin and a curing agent, self-polymerization of a thermosetting resin, or a combination of these. Examples of the thermosetting resin include an epoxy resin, an acrylic resin, a silicone resin, a phenol resin, a thermosetting polyimide resin, a polyurethane resin, a melamine resin, and a urea resin. These may be used singly or in combination of two or more kinds thereof. The thermosetting resin may include an epoxy resin from the viewpoint of having excellent heat resistance, workability, and reliability.

The epoxy resin is a compound having one or more epoxy groups. The epoxy resin may have two or more epoxy groups. Examples of the epoxy resin having two or more epoxy groups include a bisphenol A type epoxy resin, a novolac type epoxy resin (phenol novolac type epoxy resin or the like), a glycidylamine type epoxy resin, a heterocyclic ring-containing epoxy resin, and an alicyclic epoxy resin.

The curable resin composition may include a thermosetting resin and a curing agent thereof. The total content of the thermosetting resin and the curing agent thereof may be 10 parts by mass or more, 15 parts by mass or more, or 20 parts by mass or more and 60 parts by mass or less, may be 10 parts by mass or more, 15 parts by mass or more, or 20 parts by mass or more and 50 parts by mass or less, or may be 10 parts by mass or more, 15 parts by mass or more, or 20 parts by mass or more and 40 parts by mass or less, with respect to 100 parts by mass of the total mass of the curable resin composition. When the total content of the thermosetting resin and the curing agent thereof is within these ranges, there are a tendency that a thin and flat resin layer for temporary fixing can be easily formed, and a tendency that the cured resin layer for temporary fixing 10 has more excellent heat resistance.

When an epoxy resin is used as the thermosetting resin, the curable resin composition may include a curing agent for an epoxy resin. The curing agent for the epoxy resin is not particularly limited; however, examples thereof include amines, polyamides, acid anhydrides, polysulfide, boron trifluoride, bisphenols (bisphenol A, bisphenol F, bisphenol S, and the like), and phenol resins (a phenol novolac resin, a bisphenol A novolac resin, a cresol novolac resin, a phenol aralkyl resin, and the like).

The thermosetting resin composition may further include a curing accelerator that accelerates a curing reaction of a thermosetting resin such as an epoxy resin. Examples of the curing accelerator include an imidazole compound, dicyandiamide, a dicarboxylic acid dihydrazide, triphenylphosphine, tetraphenylphosphonium tetraphenylborate, 2-ethyl-4-methylimidazole-tetraphenylborate, and 1,8-diazabicyclo[5,4,0]undecene-7-tetraphenylborate. These may be used singly or in combination of two or more kinds thereof.

The content of the curing accelerator may be 0.01 to 5 parts by mass with respect to 100 parts by mass of the total amount of the thermosetting resin and the curing agent. When the content of the curing accelerator is in this range, the resin layer for temporary fixing tends to have more excellent curability and heat resistance after curing.

The curable resin composition that constitutes the resin layer for temporary fixing 10 may include a polymerizable monomer having a polymerizable unsaturated group and a polymerization initiator. Even in this case, the curable resin composition may further include the above-mentioned hydrocarbon resin.

The polymerizable monomer is a compound having a polymerizable unsaturated group such as an ethylenically unsaturated group. The polymerizable monomer may be any of a monofunctional monomer, a bifunctional monomer, and a trifunctional or higher-functional monomer; however, from the viewpoint of obtaining sufficient curability, a bifunctional or higher-functional polymerizable monomer may be used. Examples of the polymerizable monomer include a (meth)acrylate, a halogenated vinylidene, a vinyl ether, a vinyl ester, vinylpyridine, vinylamide, and an arylated vinyl. The polymerizable monomer may be a (meth)acrylate or (meth)acrylic acid. The (meth)acrylate may be a monofunctional (meth)acrylate, a bifunctional (meth)acrylate, a polyfunctional (meth)acrylate with trifunctionality or higher functionality, or a combination of these.

Examples of the monofunctional (meth)acrylate include aliphatic (meth)acrylates such as methyl (meth)acrylate, ethyl (meth)acrylate, butyl (meth)acrylate, isobutyl (meth)acrylate, tert-butyl (meth)acrylate, butoxyethyl (meth)acrylate, isoamyl (meth)acrylate, hexyl (meth)acrylate, 2-ethylhexyl (meth)acrylate, heptyl (meth)acrylate, octylheptyl (meth)acrylate, nonyl (meth)acrylate, decyl (meth)acrylate, 2-hydroxyethyl (meth)acrylate, 2-hydroxypropyl (meth)acrylate, 3-chloro-2-hydroxypropyl (meth)acrylate, 2-hydroxybutyl (meth)acrylate, methoxy polyethylene glycol (meth)acrylate, ethoxy polyethylene glycol (meth)acrylate, methoxy polypropylene glycol (meth)acrylate, ethoxy polypropylene glycol (meth)acrylate, and mono(2-(meth)acryloyloxyethyl) succinate; and aromatic (meth)acrylates such as benzyl (meth)acrylate, phenyl (meth)acrylate, o-biphenyl (meth)acrylate, 1-naphthyl (meth)acrylate, 2-naphthyl (meth)acrylate, phenoxyethyl (meth)acrylate, p-cumylphenoxyethyl (meth)acrylate, o-phenylphenoxyethyl (meth)acrylate, 1-naphthoxyethyl (meth)acrylate, 2-naphthoxyethyl (meth)acrylate, phenoxy polyethylene glycol (meth)acrylate, nonylphenoxy polyethylene glycol (meth)acrylate, phenoxy polypropylene glycol (meth)acrylate, 2-hydroxy-3-phenoxypropyl (meth)acrylate, 2-hydroxy-3-(o-phenylphenoxy)propyl (meth)acrylate, 2-hydroxy-3-(1-naphthoxy)propyl (meth)acrylate, and 2-hydroxy-3-(2-naphthoxy)propyl (meth)acrylate.

Examples of the bifunctional (meth)acrylate include aliphatic (meth)acrylates such as ethylene glycol di(meth)acrylate, diethylene glycol di(meth)acrylate, triethylene glycol di(meth)acrylate, tetraethylene glycol di(meth)acrylate, polyethylene glycol di(meth)acrylate, propylene glycol di(meth)acrylate, dipropylene glycol di(meth)acrylate, tripropylene glycol di(meth)acrylate, tetrapropylene glycol di(meth)acrylate, polypropylene glycol di(meth)acrylate, ethoxylated polypropylene glycol di(meth)acrylate, 1,3-butanediol di(meth)acrylate, 1,4-butanediol di(meth)acrylate, neopentyl glycol di(meth)acrylate, 3-methyl-1,5-pentanediol di(meth)acrylate, 1,6-hexanediol di(meth)acrylate, 2-butyl-2-ethyl-1,3-propanediol di(meth)acrylate, 1,9-nonanediol di(meth)acrylate, 1,10-decanediol di(meth)acrylate, glycerin di(meth)acrylate, tricyclodecane dimethanol (meth)acrylate, and ethoxylated 2-methyl-1,3-propanediol di(meth)acrylate; and aromatic (meth)acrylates such as ethoxylated bisphenol A di(meth)acrylate, propoxylated bisphenol A di(meth)acrylate, ethoxylated propoxylated bisphenol A di(meth)acrylate, ethoxylated bisphenol F di(meth)acrylate, propoxylated bisphenol F di(meth)acrylate, ethoxylated propoxylated bisphenol F di(meth)acrylate, ethoxylated fluorene type di(meth)acrylate, propoxylated fluorene type di(meth)acrylate, and ethoxylated propoxylated fluorene type di(meth)acrylate.

Examples of the polyfunctional (meth)acrylate with trifunctionality or higher functionality include aliphatic (meth)acrylates such as trimethylolpropane tri(meth)acrylate, ethoxylated trimethylolpropane tri(meth)acrylate, propoxylated trimethylolpropane tri(meth)acrylate, ethoxylated propoxylated trimethylolpropane tri(meth)acrylate, pentaerythritol tri(meth)acrylate, ethoxylated pentaerythritol tri(meth)acrylate, propoxylated pentaerythritol tri(meth)acrylate, ethoxylated propoxylated pentaerythritol tri(meth)acrylate, pentaerythritol tetra(meth)acrylate, ethoxylated pentaerythritol tetra(meth)acrylate, propoxylated pentaerythritol tetra(meth)acrylate, ethoxylated propoxylated pentaerythritol tetra(meth)acrylate, ditrimethylolpropane tetraacrylate, and dipentaerythritol hexa(meth)acrylate; aromatic epoxy (meth)acrylates such as phenol novolac type epoxy (meth)acrylate and cresol novolac type epoxy (meth)acrylate.

These (meth)acrylates may be used singly or in combination of two or more kinds thereof. These (meth)acrylates may be used in combination with other polymerizable monomers.

The content of the polymerizable monomer may be 10 to 60 parts by mass with respect to 100 parts by mass of the mass of the curable resin composition that constitutes the resin layer for temporary fixing 10.

The polymerization initiator is a compound that initiates a polymerization reaction of the polymerizable monomer by heating or irradiation with ultraviolet radiation or the like. For example, when the polymerizable monomer is a compound having an ethylenically unsaturated group, the polymerization initiator may be a thermoradical polymerization initiator, a photoradical polymerization initiator, or a combination of these.

Examples of the thermoradical polymerization initiator include diacyl peroxides such as octanoyl peroxide, lauroyl peroxide, stearyl peroxide, and benzoyl peroxide; peroxy esters such as t-butyl peroxypivalate, t-hexyl peroxypivalate, 1,1,3,3-tetramethylbutyl peroxy-2-ethyl hexanoate, 2,5-dimethyl-2,5-bis(2-ethylhexanoylperoxy)hexane, t-hexyl peroxy-2-ethylhexanoate, t-butyl peroxy-2-ethylhexanoate, t-butyl peroxyisobutyrate, t-hexyl peroxyisopropyl monocarbonate, t-butyl peroxy-3,5,5-trimethylhexanoate, t-butyl peroxylaurylaute, t-butyl peroxyisopropyl monocarbonate, t-butyl peroxy-2-ethylhexyl monocarbonate, t-butyl peroxybenzoate, t-hexyl peroxybenzoate, 2,5-dimethyl-2,5-bis(benzoylperoxy)hexane, and t-butyl peroxyacetate; and azo compounds such as 2,2'-azobisisobutyronitrile, 2,2'-azobis(2,4-dimethylvaleronitrile), and 2,2'-azobis(4-methoxy-2'-dimethylvaleronitrile).

Examples of the photoradical polymerization initiator include benzoin ketals such as 2,2-dimethoxy-1,2-diphenylethan-1-one; α-hydroxy ketones such as 1-hydroxycyclohexyl phenyl ketone, 2-hydroxy-2-methyl-1-phenylpropan-1-one, and 1-[4-(2-hydroxyethoxy)phenyl]-2-hydroxy-2-methyl-1-propan-1-one; and phosphine oxides such as bis(2,4,6-trimethylbenzoyl)phenylphosphine oxide, bis(2,6-dimethoxybenzoyl)-2,4,4-trimethylpentylphosphine oxide, and 2,4,6-trimethylbenzoyldiphenylphosphine oxide.

These thermoradical and photoradical polymerization initiators may be used singly or in combination of two or more kinds thereof.

The content of the polymerization initiator may be 0.01 to 5 parts by mass with respect to 100 parts by mass of the total amount of the polymerizable monomer.

The curable resin composition that constitutes the resin layer for temporary fixing 10 may further include an insulating filler, a sensitizer, an oxidation inhibitor, and the like as other components.

The insulating filler is added for the purpose of imparting low thermal expansion properties and low hygroscopic properties to the curable resin composition. Examples of the insulating filler include non-metal inorganic fillers such as silica, alumina, boron nitride, titania, glass, and ceramics. These insulating fillers may be used singly or in combination of two or more kinds thereof.

The content of the insulating filler may be 5 to 20 parts by mass with respect to 100 parts by mass of the total mass of the curable resin composition that constitutes the resin layer for temporary fixing 10. When the content of the insulating filler is within this numerical value range, the cured resin layer for temporary fixing 10 tends to have excellent heat resistance and satisfactory releasability.

Examples of the sensitizer include anthracene, phenanthrene, chrysene, benzopyrene, fluoranthene, rubrene, pyrene, xanthone, indanthrene, thioxanthen-9-one, 2-isopropyl-9H-thioxanthen-9-one, 4-isopropyl-9H-thioxanthen-9-one, and 1-chloro-4-propoxythioxanthone. The content of the sensitizer may be 0.01 to 10 parts by mass with respect to 100 parts by mass of the total mass of the curable resin composition that constitutes the resin layer for temporary fixing 10.

Examples of the oxidation inhibitor include quinone derivatives such as benzoquinone and hydroquinone; phenol derivatives such as 4-methoxyphenol and 4-t-butylcatechol;

aminoxyl derivatives such as 2,2,6,6-tetramethylpiperidin-1-oxyl and 4-hydroxy-2,2,6,6-tetramethylpiperidin-1-oxyl; and hindered amine derivatives such as tetramethylpiperidyl methacrylate. The content of the oxidation inhibitor may be 0.1 to 10 parts by mass with respect to 100 parts by mass of the total mass of the curable resin composition that constitutes the resin layer for temporary fixing 10.

The resin varnish used for forming the resin layer for temporary fixing 10 includes each of the components of the curable resin composition mentioned above and a solvent. The solvent may be a mixed solvent including two or more kinds of solvents. There is a tendency that second principal surface 10S2 of a resin layer for temporary fixing 10 formed by removing solvents from a resin varnish including two or more kinds of solvents having different boiling points, is likely to have lower viscosity. Examples of the solvent include aromatic solvents such as toluene, xylene, and limonene; and cyclohexanone. A mixed solvent can include, for example, an aromatic solvent and cyclohexanone. The concentration of the components other than the solvent in the resin varnish may be, for example, 10% to 30% by mass based on the mass of the resin varnish.

EXAMPLES

Hereinafter, the present invention will be more specifically described by way of Examples. However, the present invention is not intended to be limited to these Examples.
1. Film Material for Temporary Fixing The following release films to be used as a base material film or a protective film were prepared.
  PUREX A31B (trade name): Light releasing type, polyethylene terephthalate (PET) film, TOYOBO FILM SOLUTIONS LIMITED, thickness: 38 μm
  PUREX A70J (trade name): Heavy releasing type, PET film, TOYOBO FILM SOLUTIONS LIMITED, thickness: 38 μm A resin varnish including 35 parts by mass of a maleic anhydride-modified styrene-ethylene-butylene-styrene block copolymer (trade name: FG1924GT, KRATON CORPORATION, styrene content 13% by mass), 35 parts by mass of a maleic anhydride-modified styrene-ethylene-butylene-styrene block copolymer (trade name: FG1901GT, KRATON CORPORATION, styrene content 13% by mass), 15 parts by mass of a dicyclopentadiene type epoxy resin (trade name: HP7200, DIC Corporation), 15 parts by mass of a naphthalene type epoxy resin (trade name: HP4710, DIC Corporation), 0.8 parts by mass of a phenol-based oxidation inhibitor (trade name: AO-60, ADEKA Corporation), and 2 parts by mass of 1-cyanoethyl-2-phenylimidazole (trade name: 2PZ-CN, SHIKOKU CHEMICALS CORPORATION), as well as toluene and cyclohexanone as solvents was prepared. The mass ratio of toluene and cyclohexanone was 1.0:2.6.

The obtained resin varnish was applied on a release surface of a base material film (PUREX A31B) by using a precision coating machine, the solvents were removed from the coating film by heating at 90° C. for 5 minutes and subsequently at 100° C. for 5 minutes, and a resin layer for temporary fixing having a thickness of 80 μm was produced. A protective film (PUREX A70J) was stuck to the surface of the resin layer for temporary fixing on the opposite side from the base material film, in a direction in which the release surface of the protective film was in contact with the resin layer for temporary fixing. As a result, a film material for temporary fixing composed of a base material film (first release film), a resin layer for temporary fixing, and a protective film (second release film) was obtained.

Immediately after (initial) the production of the film material for temporary fixing, the base material film could be peeled off while leaving the resin layer for temporary fixing on the protective film side. Even after storing the film material for temporary fixing in a refrigerator for one week, the base material film could be similarly peeled off. On the other hand, in the case of a film material for temporary fixing produced by the same method as described above except that the protective film was changed to A31B of light releasing type, immediately after production, the base material film could not be peeled off while leaving the resin layer for temporary fixing on the protective film side.
2. Rigid Pendulum Test A principal surface 10S1 on the base material film (PUREX A31B) side and a principal surface 10S2 on the protective film (PUREX A70J) side of the resin layer for temporary fixing were evaluated by using a rigid pendulum tester (RPT-3000W (trade name), A & D Company, Ltd.) under the following conditions.
  Temperature range: 25° C. to 150° C.
  Temperature increase rate: 5° C./min
  Edge: RBP-040 (cylindrical shape)

Figure 7:
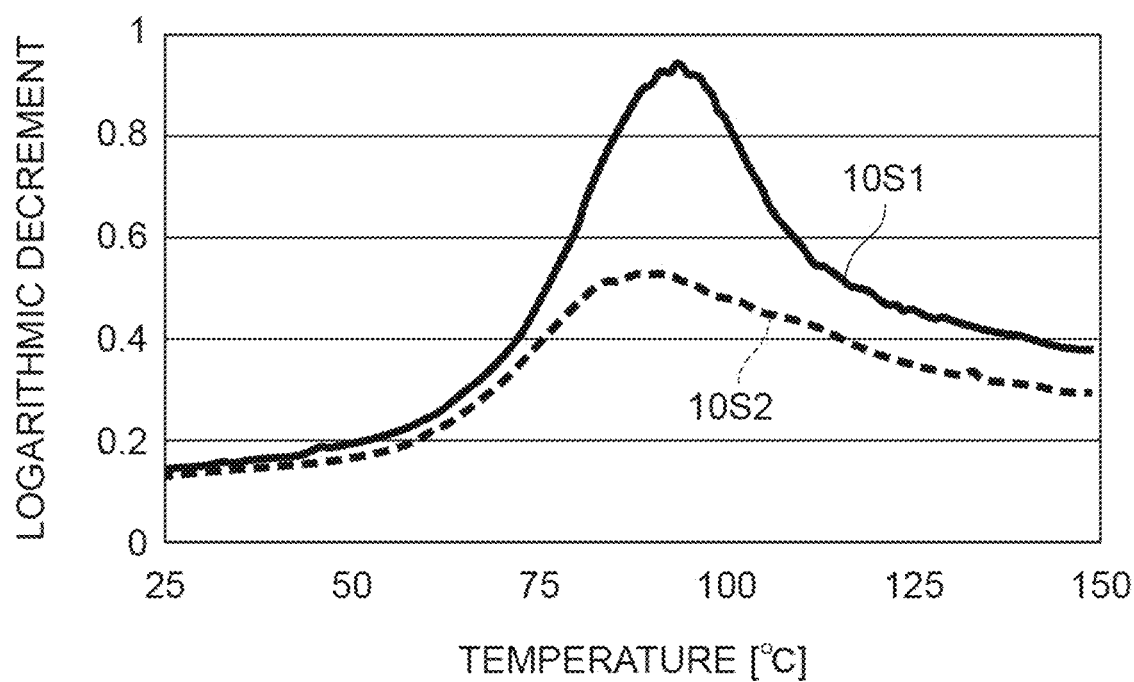
FIG. 7 is a graph showing the relationship between logarithmic decrement and temperature in rigid pendulum measurement.

The measurement results are shown in FIG. 7. FIG. 7 is a graph showing the relationship between logarithmic decrement and temperature. The maximum value of the logarithmic decrement exhibited by the principal surface 10S2 on the protective film (second release film) side was smaller than the maximum value of the logarithmic decrement exhibited by the principal surface 10S2 on the base material film (first release film) side. The maximum value of logarithmic decrement was 0.94 at the principal surface 10S1 on the base material film (first release film) side, and the maximum value of logarithmic decrement was 0.53 at the principal surface 10S2 on the protective film (second release film) side.
3. Evaluation
Test 1

A metal layer-attached support member having a glass substrate and a metal layer (laminated body of Ti layer (thickness 50 nm)/copper layer (200 nm)) formed on the glass substrate by a sputtering method, was prepared. The base material film or the protective film was peeled off from the film material for temporary fixing, and the film material for temporary fixing was laminated on the metal layer in a direction in which the exposed principal surface 10S1 or 10S2 of the resin layer for temporary fixing was in contact with the metal layer. Next, the base material film or protective film remaining on the resin layer for temporary fixing was peeled off.

On the exposed principal surface 10S1 or 10S2 of the resin layer for temporary fixing, a semiconductor chip having bumps as connection terminals was placed, and the resin layer for temporary fixing was thermally cured in that state to temporarily fix the semiconductor chip such that the bumps were embedded in the resin layer for temporary fixing. A sealing layer sealing the semiconductor chip was formed by using a sealing agent, and a sealing structural body having the resin layer for temporary fixing attached thereto was formed on the metal layer-attached support member.

Figure 8:
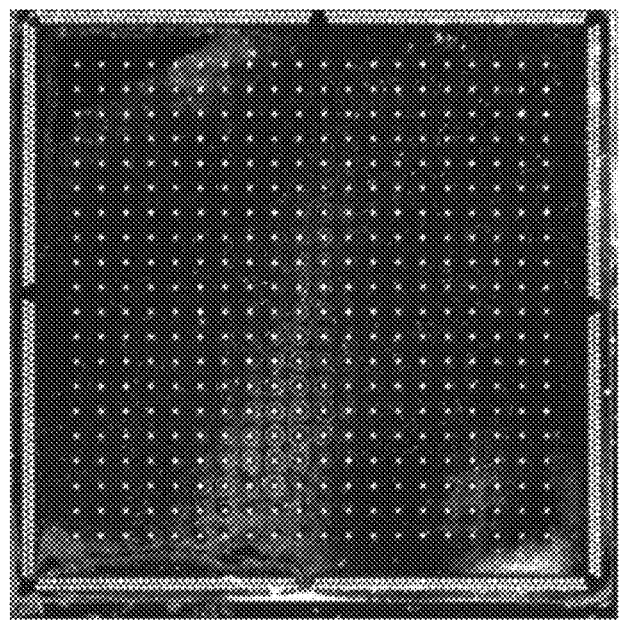
FIG. 8 is optical micrographs of a semiconductor chip detached from a resin layer for temporary fixing.
Figure 8:
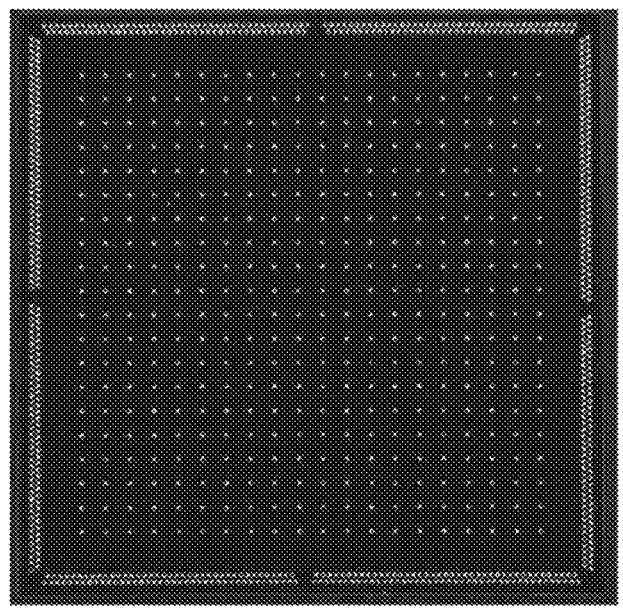
Figure 9:
FIG. 9 is optical micrographs of a semiconductor chip detached from a resin layer for temporary fixing.
Figure 9:
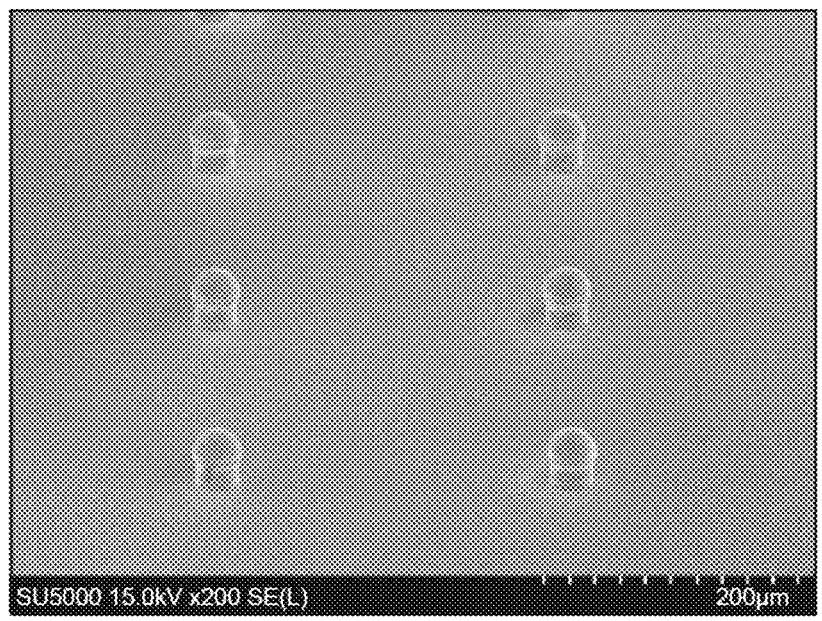

The assembly was irradiated by using a xenon lamp through the glass base material side under the irradiation conditions of an applied voltage of 3800 V, a pulse width of 300 μs, an irradiation distance of 50 mm, a number of times of irradiation of one time, and an irradiation time of 200 μs, to detach the resin layer for temporary fixing and the sealing structural body from the support member. Thereafter, tensile stress was added to the resin layer for temporary fixing, and the resin layer for temporary fixing was torn off from the sealing structural body to detach the sealing structural body from the resin layer for temporary fixing. The irradiation distance is the distance between the light source and the stage where the slide glass was installed. After the detachment, the exposed surface on the bump side of the semiconductor chip was observed with an optical microscope or a scanning electron microscope. FIG. 8 is optical micrographs of the semiconductor chip, and FIG. 9 is scanning electron micrographs. In FIG. 8 and FIG. 9, (a) is a photograph in a case where a semiconductor chip was temporarily fixed onto the principal surface 10S1 on the base material film (first release film) side of the resin layer for temporary fixing, and (b) is a photograph in a case where a semiconductor chip was temporarily fixed onto the principal surface 10S2 on the protective film (second release film) side of the resin layer for temporary fixing. As shown in FIG. 8(a) and FIG. 9(a), when the principal surface 10S2 on the protective film side of the resin layer for temporary fixing was stuck together with the metal layer, and a semiconductor chip was temporarily fixed onto the principal surface 10S1 on the base material film side, a large amount of resin residue originating from the resin layer for temporary fixing was generated. In the photograph of FIG. 9(a), resin residue was observed in, for example, the portion surrounded by a broken-lined circle. On the other hand, as shown in FIG. 8(b) and FIG. 9(b), when the principal surface 10S1 on the base material film side of the resin layer for temporary fixing was stuck together with the metal layer, and a semiconductor chip was temporarily fixed onto the principal surface 10S2 on the protective film side, generation of resin residue originating from the resin layer for temporary fixing was not recognized.

Test 2

A film material for temporary fixing was produced in the same manner as in Test 1, except that the solvent was changed to a mixed solvent of toluene, limonene, and cyclohexanone (CHN), or a mixed solvent of xylene and cyclohexanone (CHN), and the presence or absence of resin residue on the semiconductor chip was checked. In all of the film materials for temporary fixing, when the semiconductor chip was temporarily fixed onto the principal surface 10S2 on the protective film side, generation of resin residue was not recognized. The viscosity at 100° C. of each resin layer for temporary fixing, the storage modulus of the resin layer for temporary fixing after curing, and the peel strengths of the base material film and the protective film were measured by the following procedure. The measurement results are shown in Table 1.

Viscosity

The viscosity of the resin layer for temporary fixing was measured under the conditions of a temperature increase rate of 10° C./min, and the viscosity at 100° C. was determined.

Storage Modulus

The resin layer for temporary fixing was cut out into a predetermined size (20 mm in length (distance between chucks)×5.0 mm in width) and was thermally cured in a clean oven (manufactured by ESPEC CORP.) under the conditions of 180° C. for 2 hours to obtain a test specimen of the cured resin layer for temporary fixing. The storage modulus at 25° C. and 270° C. were measured by viscoelasticity measurement under the following conditions. The results are shown in Table 1.

Apparatus name: Dynamic viscoelasticity measuring apparatus (manufactured by TA Instruments, Inc., RSA-G2)
Measurement temperature region: −70° C. to 300° C.
Temperature increase rate: 5° C./min
Frequency: 1 Hz
Measurement mode: Tensile mode Peel Strength The peel strength was evaluated by measuring the 90° peel strength between a silicon mirror wafer and the resin layer for temporary fixing. A silicon mirror wafer (6-inch) having a thickness of 625 μm was disposed on a stage of a vacuum laminator (manufactured by NPC Incorporated, LM-50X50-S), the release film of the resin layer for temporary fixing was peeled off, and the release film was disposed such that the principal surface of the film for temporary fixing was in contact with the silicon mirror wafer. The assembly was heated and pressed at a temperature of 120° C. and a pressure of 0.1 MPa for 2 minutes under the conditions of 1.5 kPa (15 mbar) and was vacuum laminated to obtain a sample. The obtained sample was subsequently heated at 200° C. for one hour to be cured. Thereafter, a sample for measurement having a width of 10 mm was cut out from the sample. The sample for measurement was subjected to a peel test at a rate of 50 mm/min with a peel testing machine set such that the peel angle was 90°, and the peel strength was determined from the test results. Measurement was performed for both the principal surfaces 10S1 and 10S2. The results are shown in Table 1.

TABLE 1

| | Solvent | Toluene/ CHN | Toluene/ limonene/ CHN | Xylene/ CHN |
|---|---|---|---|---|
| Thickness [μm] | | 80 | 80 | 80 |
| Viscosity (before curing) [Pa · s] | 100° C. | 101000 | 85300 | 70500 |
| Storage modulus (after curing) [MPa] | 25° C. | 82 | 71 | 75 |
| | 270° C. | 1.8 | 1.2 | 1.7 |
| Peel strength [N/25 mm] | Protective film | 9.3 | 11.2 | 10.5 |
| | Base material film | 14.8 | 12.5 | 13.4 |
| Resin residue | Principal surface 10S2 (protective film side) | Absent | Absent | Absent |
| | Principal surface 10S1 (base material film side) | Present | Present | Present |

REFERENCE SIGNS LIST

1: film material for temporary fixing, 3: semiconductor member, 4: sealing layer, 10: resin layer for temporary fixing, 10S1: first principal surface, 10S2: second principal surface, 11: first release film, 11S, 12S: release surface, 12: second release film, 15: laminated body for temporary fixing, 21: support substrate, 21S1: support surface, 21S2: back surface, 22: light-absorbing layer, 50: sealing structural body.

The invention claimed is:

1. A method for manufacturing a semiconductor device, the method comprising:
    forming a laminated body for temporary fixing, the laminated body including a support substrate having a support surface and a back surface on an opposite side thereof, a light-absorbing layer, and a resin layer for temporary fixing having a first principal surface and a second principal surface on an opposite side thereof, the light-absorbing layer and the resin layer for temporary fixing being laminated in this order on the support surface;

temporarily fixing a semiconductor member on the resin layer for temporary fixing by curing the resin layer for temporary fixing; and separating the semiconductor member from the resin layer for temporary fixing by:
  irradiating the laminated body for temporary fixing with light from the back surface side; and
  peeling off the resin layer for temporary fixing from the semiconductor member after irradiating the laminated body, wherein the laminated body for temporary fixing is formed by:
  preparing a film material for temporary fixing having the resin layer for temporary fixing, a first release film, and a second release film, the first release film, the resin layer for temporary fixing, and the second release film being laminated in this order so that the first release film is in contact with the first principal surface of the resin layer for temporary fixing, and the second release film is in contact with the second principal surface of the resin layer for temporary fixing;
  peeling off the first release film from the film material for temporary fixing, and laminating the film material for temporary fixing on the light-absorbing layer provided on the support surface so that the exposed first principal surface of the resin layer for temporary fixing is in contact with the light-absorbing layer; and
  peeling off the second release film from the film material for temporary fixing and exposing the second principal surface of the resin layer for temporary fixing, wherein maximum values of logarithmic decrements of the first principal surface and the second principal surface of the resin layer for temporary fixing in rigid pendulum measurement are respectively designated as $\delta_{max}1$ and $\delta_{max}2$, and $\delta_{max}2$ is smaller than $\delta_{max}1$, and wherein the logarithmic decrements are measured over a temperature range below a curing temperature of the resin layer for temporary fixing.

2. The method according to claim 1, wherein the laminated body for temporary fixing is irradiated with light from the back surface side to separate the resin layer for temporary fixing from the light-absorbing layer.

3. The method according to claim 1, wherein the method further includes processing the semiconductor member temporarily fixed onto the resin layer for temporary fixing.

4. The method according to claim 1, wherein the method further includes: forming a sealing layer sealing the semiconductor member on the resin layer for temporary fixing; and thereby forming a sealing structural body having the semiconductor member and the sealing layer.

5. The method according to claim 1, wherein preparing the film material for temporary fixing comprises:
  applying a resin varnish including a solvent on the first release film to form a film of the resin varnish and subsequently removing the solvent from the film to form the resin layer for temporary fixing having the first principal surface that is in contact with the first release film and the second principal surface on the opposite side thereof, on the first release film; and
  sticking the second release film to the second principal surface of the resin layer for temporary fixing,
  wherein a peel strength of a surface of the first release film, the surface being in contact with the resin layer for temporary fixing, is smaller than a peel strength of a surface of the second release film, the surface being in contact with the resin layer for temporary fixing.

6. The method according to claim 5, wherein the solvent is a mixed solvent including two or more kinds of solvents.

7. The method according to claim 1, wherein the temperature range that the logarithmic decrements are measured over is from 25° C. to 150° C.

8. The method according to claim 7, wherein the curing temperature of the resin layer for temporary fixing is from 180° C. to 300° C.

9. The method according to claim 1, wherein the maximum values of logarithmic decrements reflect a degree of viscosity of the first principal surface and the second principal surface of the resin layer for temporary fixing, and
  wherein the second principal surface has a lower viscosity than the first principal surface in the temperature range.

* * * * *